US011469337B2

(12) United States Patent
Makurin et al.

(10) Patent No.: US 11,469,337 B2
(45) Date of Patent: Oct. 11, 2022

(54) OPTICALLY CONTROLLED MILLIMETER-WAVE SWITCH BASED ON SUBSTRATE INTEGRATED WAVEGUIDE

(71) Applicant: SAMSUNG ELECTRONICS CO., LTD., Suwon-si (KR)

(72) Inventors: Mikhail Nikolaevich Makurin, Domodedovo (RU); Gennadiy Alexandrovich Evtyushkin, Moscow (RU); Anton Sergeevich Lukyanov, Moscow (RU); Artem Yurievich Nikishov, Kolomna (RU); Elena Aleksandrovna Shepeleva, Kostroma (RU)

(73) Assignee: Samsung Electronics Co., Ltd., Suwon-si (KR)

( * ) Notice: Subject to any disclaimer, the term of this patent is extended or adjusted under 35 U.S.C. 154(b) by 151 days.

(21) Appl. No.: 17/019,754

(22) Filed: Sep. 14, 2020

(65) Prior Publication Data
US 2021/0091242 A1 Mar. 25, 2021

(30) Foreign Application Priority Data

Sep. 24, 2019 (RU) .......................... RU2019130008
Aug. 11, 2020 (KR) ....................... 10-2020-0100414

(51) Int. Cl.
*H01L 31/0232* (2014.01)
*H01L 31/16* (2006.01)
(Continued)

(52) U.S. Cl.
CPC ...... *H01L 31/02327* (2013.01); *G02B 6/2861* (2013.01); *G02B 6/4295* (2013.01); *H01L 27/144* (2013.01); *H01L 31/16* (2013.01)

(58) Field of Classification Search
CPC ............... H01L 31/02327; H01L 31/16; H01L 31/0203; H01L 31/02325; H01L 31/09;
(Continued)

(56) References Cited

U.S. PATENT DOCUMENTS 5,401,953 A 3/1995 Spencer et al.
6,759,668 B2 * 7/2004 Matsuo ............... H01L 27/1443
250/214 SW
(Continued)

FOREIGN PATENT DOCUMENTS

JP 2007-74043 A 3/2007

*Primary Examiner* — Sitaramarao S Yechuri
(74) *Attorney, Agent, or Firm* — NSIP Law

(57) ABSTRACT

An optically controlled switch includes a substrate integrated waveguide (SIW) including: a first port and a second port, the first port and the second port being located at ends of the SIW to input and output an electromagnetic wave; and a shorting via electrically connected to a bottom layer of the SIW and separated from a top layer of the SIW by a dielectric gap. The optically controlled switch includes: a photoconductive element located on the top layer of the SIW and electrically connected to the shorting via and the top layer of the SIW, the photoconductive element being configured to have a dielectric state and a conductor state depending on a state of a controlling light flux; and a cutoff waveguide formed around the dielectric gap and the photoconductive element, and configured to provide control of the photoconductive element from a light source and block parasitic radiation.

17 Claims, 8 Drawing Sheets
(2 of 8 Drawing Sheet(s) Filed in Color)

(51) Int. Cl.
*H01L 27/144* (2006.01)
*G02B 6/28* (2006.01)
*G02B 6/42* (2006.01)

(58) Field of Classification Search
CPC ... H01L 27/144; G02B 6/2861; G02B 6/4295; H01P 1/10
See application file for complete search history.

(56) References Cited

U.S. PATENT DOCUMENTS

| | | |
|---|---|---|
| 2003/0227351 A1* | 12/2003 | Sievenpiper ............ H01P 5/04 333/105 |
| 2004/0007661 A1 | 1/2004 | Matsuo et al. |
| 2004/0046106 A1* | 3/2004 | Nakano ............ H01L 31/0203 250/214 LS |
| 2006/0085160 A1 | 4/2006 | Ouchi |
| 2009/0261258 A1* | 10/2009 | Harris .................... H03C 1/34 250/370.01 |
| 2009/0322611 A1 | 12/2009 | Manasson et al. |
| 2011/0101891 A1 | 5/2011 | Caporaso et al. |
| 2014/0038321 A1 | 2/2014 | Caporaso |
| 2019/0131482 A1 | 5/2019 | Conway et al. |

* cited by examiner

US 11,469,337 B2

OPTICALLY CONTROLLED MILLIMETER-WAVE SWITCH BASED ON SUBSTRATE INTEGRATED WAVEGUIDE

CROSS-REFERENCE TO RELATED APPLICATIONS

This application claims the benefit under 35 USC § 119(a) of Russian Patent Application No. 2019130008 filed on Sep. 24, 2019 in the Russian Patent Office, and Korean Patent Application No. 10-2020-0100414 filed on Aug. 11, 2020 in the Korean Intellectual Property Office, the entire disclosures of which are incorporated herein by reference for all purposes.

BACKGROUND

1. Field

The following description relates to radio engineering, and, for example, an optically controlled millimeter-wave switch based on a substrate integrated waveguide (SIW).

2. Description of Related Art

Currently, millimeter-wave networks and devices, such as 5G and 6G, WiGig, automotive radars, and the like, are being developed. The appearance of such new applications in the millimeter-wave range for frequencies above 30 GHz requires the development of a new class of elements and circuits (active elements, antennas, printed circuit boards (PCBs), feeders, and switching devices) that may integrate, within a single device, data transmission and detection capabilities, and capabilities of searching an optimal transmission direction. For example, a switch is an important component for many applications, since the switch allows control of the switching of signal propagation channels.

At frequencies above 30 GHz, technological features of the device implementation have a great importance, because the wavelengths of the propagating waves are very small, and any discontinuity in propagation paths, which would not be significant for lower frequencies, may lead to parasitic and noise effects. Accordingly, conventional switches for lower frequencies become inappropriate for high frequencies due to high losses.

At frequencies above 40 GHz in such a switch, parasitic radiation occurs through both the partially covered and fully covered dielectric gap, because the photoconductive element covering the dielectric gap is made of materials having a relatively high dielectric constant (for example, about 12 for silicon), which creates conditions for radiation. As a result, losses are increased, matching in the RF path in an open state is degraded, external crosstalk is increased, ON/OFF isolation is degraded, and increased optical power is required from a control light source. The heat produced by such increased optical power reduces its working life.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an optically controlled switch includes a substrate integrated waveguide (SIW) including: a first port and a second port, the first port and the second port being located at ends of the SIW to input and output an electromagnetic wave; and a shorting via electrically connected to a bottom layer of the SIW and separated from a top layer of the SIW by a dielectric gap. The optically controlled switch includes: a photoconductive element located on the top layer of the SIW and electrically connected to the shorting via and the top layer of the SIW, the photoconductive element being configured to have a dielectric state and a conductor state depending on a state of a controlling light flux; and a cutoff waveguide formed around the dielectric gap and the photoconductive element, and formed by conductive walls projecting from the top layer of the SIW, the cutoff waveguide being configured to provide control of the photoconductive element from a light source and block parasitic radiation of a wave passing through the SIW via the dielectric gap and the photoconductive element.

A wall height of the cutoff waveguide may be greater than or equal to a quarter of a critical wavelength of the cutoff waveguide.

An internal cavity of the cutoff waveguide may be filled with air. The critical wavelength may be higher than an operating frequency of the switch.

An internal cavity of the cutoff waveguide may be filled with a dielectric material. The critical wavelength may be a critical wavelength for the cutoff waveguide, formed as an air-filled cutoff waveguide, divided by a squared dielectric constant of the dielectric material.

The cutoff waveguide may have a cross-section in the form of a rectangle with a size of a×b, wherein a is greater than b, and a is less than half a critical wavelength for the cutoff waveguide.

The cutoff waveguide may have a cross-section in the form of a circle having a radius, and wherein the radius is less than the critical wavelength of the cutoff waveguide.

The optically controlled switch may further include an optically transparent element configured to provide control of the photoconductive element from the light source, and having a form of a conductive grid covering a hole in the cutoff waveguide. A cell size of the optically transparent element may be less than a critical wavelength for the cutoff waveguide.

The optically controlled switch may further include the light source. The light source may be configured to provide light to the photoconductive element. The optically transparent element may be disposed on a surface of the light source exposed to the photoconductive element.

The SIW may further include: a printed circuit board (PCB) including the top layer of the SIW, the bottom layer of the SIW, and a dielectric layer between the top layer and the bottom layer; and at least two rows of vias connected to the top layer and the bottom layer of the PCB and configured to form side walls of the SIW. Neighboring vias in the rows of vias may be arranged apart from each other at a distance less than one tenth of a wavelength of an electromagnetic wave fed to the switch.

The distance may be more than half an operating wavelength.

The optically controlled switch may further include the light source. The light source may be configured to provide light to the photoconductive element.

The cutoff waveguide may further include a section accommodating the light source.

The cutoff waveguide may be constructed of a PCB having one or more layers.

All layers of the PCB may be conductive.

The substrates of the PCB may be made of a dielectric material. The conductive walls may be formed by rows of vias connecting conductive layers of the PCB to each other.

The optically controlled switch may be formed in a single housing constructed of a conductive or dielectric material.

The optically controlled switch may further include the light source. The light source may include an LED disposed above the photoconductive element, and disposed in or above an upper portion of the cutoff waveguide.

The optically controlled switch may further include the light source. The light source may include an optical fiber fixed inside an upper portion of the cutoff waveguide.

Other features and aspects will be apparent from the following detailed description, the drawings, and the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Figure 1A:
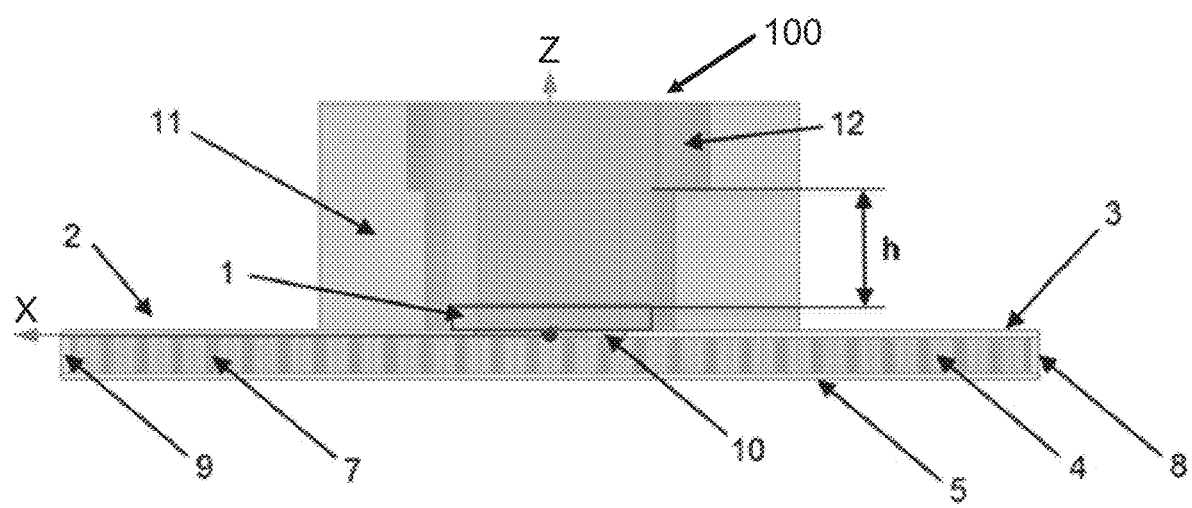
FIGS. 1A to 1C illustrate an example of an optically controlled switch.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1B:
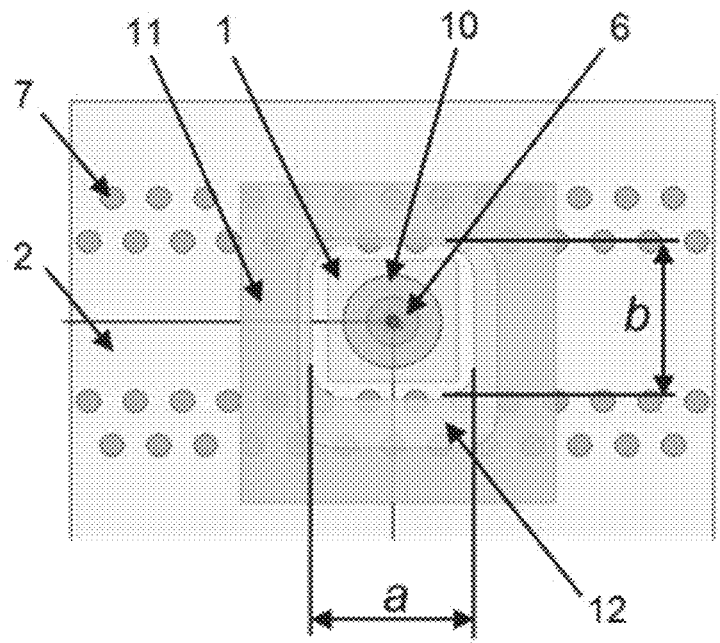
Figure 1C:
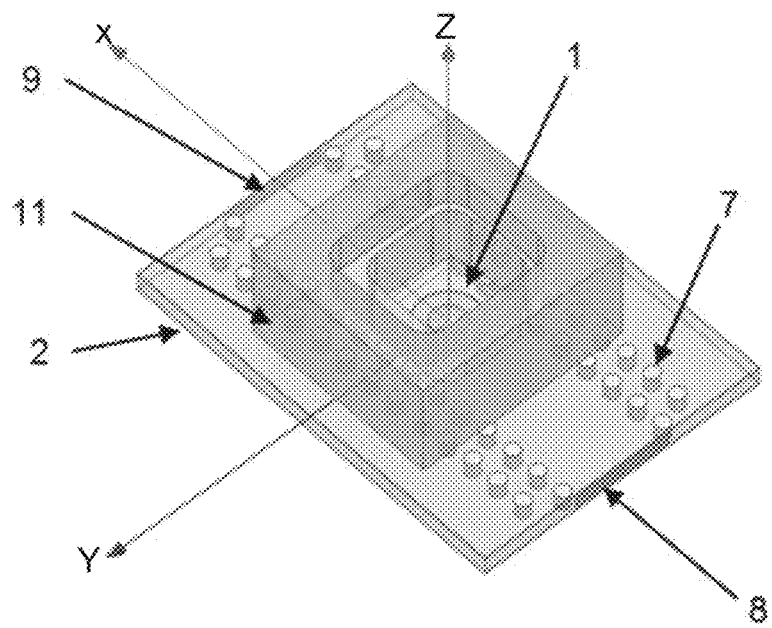

FIGS. 1A to 1C are side, top, and perspective views of an optically controlled switch 100 (hereinafter, also referred to as a switch), according to an embodiment.

Referring to FIGS. 1A to 1C, the optically controlled switch 100 includes a photoconductive element (PE) 1 installed on a printed circuit board (PCB) 2. The PCB 2 includes a top metalized layer 3, a dielectric layer 4, and a bottom metalized layer 5. Along the illustrated segment of the PCB 2, parallel rows of metalized vias 7 are located at a predetermined distance from the PE 1, and form boundaries (side walls) of a substrate integrated waveguide (SIW). The distance between the rows of vias 7 is selected based on the restrictions on the width of the waveguide and should be more than half the operating wavelength, taking into account a dielectric filling of the waveguide.

The structure shown in FIGS. 1A to 1C also includes a first RF port 8 and a second RF port 9. For example, the SIW includes the first port 8 and the second port 9 that are located at ends of the SIW to input and output an electromagnetic wave. The vias 7 may be connected to the top metalized layer 3 and the bottom metalized layer 5 of the PCB 2 and form the side walls of the SIW. The vias 7 are formed in at least two rows. The distance between adjacent vias 7 should be less than $\lambda/10$ (less than one tenth of the wavelength corresponding to the higher frequency of a frequency range of signals fed to the SIW) that almost completely suppresses the parasitic radiation outside the implemented waveguide. For example, neighboring vias in the rows of the vias 7 may be arranged apart from each other at a distance less than one tenth of a wavelength of an electromagnetic wave which is fed to the switch 100. The distance between the neighboring vias may be more than half an operating wavelength.

A shorting via 6 is located approximately midway between the walls of the waveguide in the PCB 2. The shorting via 6 is in direct contact with the bottom metalized layer 5, but is not in direct contact with the top metalized layer 3 of the PCB 2, and is separated from the top metalized layer 3 by a dielectric gap 10. For example, the PCB 2 (for example, the SIW) may include the shorting via 6 that is in direct contact with the bottom metalized layer 5, but separated from the top metalized layer 3 of the PCB 2 by the dielectric gap 10. The PE 1 interconnects the shorting via 6 and the top metalized layer 3. The PE 1 may completely cover the dielectric gap 10.

The PE 1 may have a dielectric state and a conductor state depending on a state of a controlling light flux. For example, when light falls on the PE 1, the PE 1 is in the conductor state. For example, when light does not fall on the PE 1, the PE 1 is in the dielectric state.

For example, when light falls on the PE 1, the PE 1 is in the conductor state, such that the shorting via 6 becomes active and shorts the top metalized layer 3 to the bottom metalized layer 5. The currents flowing along the waveguide walls through the shorting via 6 short the top metalized layer 3 and the bottom metalized layer 5 and form a closed loop. As a result, an electromagnetic signal or electromagnetic wave fed in the SIW on the first port 8 is reflected at the location of the PE 1 and the shorting via 6 and substantially does not pass to the second port 9.

For example, when light does not fall on the PE 1, the PE 1 is in the dielectric state, the shorting via 6 is inactive, and the electromagnetic signal fed in the SIW through the first port 8 passes with some losses to the port 9. A part of the electromagnetic signal losses may be defined by losses caused by radiation through the dielectric gap 10 and the PE 1, because the materials used for the PE 1 typically have a relatively high dielectric constant, which creates conditions for radiation of the dielectric gap 10 as a ring radiator.

To prevent such parasitic radiation, a cutoff waveguide 11 is formed on the PCB 2 around the dielectric gap 10 and the PE 1 by conductive walls projecting above the top metalized layer 3, and closely fitting to the PE 1 and the top metalized layer 3. The upper part of the cutoff waveguide 11 is designed to provide control of the PE 1. For example, the upper part of the cutoff waveguide 11 has a hole for transmitting light or for introducing the light source itself into the cavity of the waveguide 11, partially or completely. In addition, the cutoff waveguide 11 may include light source control elements. The light source may be configured to provide light to the PE 1.

The internal dimensions of the cutoff waveguide 11 are set to block the radiation through the PE 1. Blocking of the parasitic radiation also results in the system being shielded from external electromagnetic influences. The blocking of the parasitic radiation facilitates the task of matching the PE 1 with the SIW (that is, minimization of signal losses associated with its reflection from the discontinuity of the PE 1, the shorting via 6, and the dielectric gap 10). The dimensions of the pad of the via 6 and the dielectric gap 10 may be selected in order to compensate for the reactivity of the intrinsic capacitance of the PE 1, taking into account the inductance of the shorting via 6 itself. The electromagnetic signal fed to the first port 8 may thereby pass to the second port 9 with minimal losses.

For the purposes of the disclosure herein, various external and internal forms of cutoff waveguides are applicable. For example, the internal cross-section of the cutoff waveguide may be rectangular, circular, or may have a different shape. The external shape of the cutoff waveguide may be rectangular, square, cylindrical, or other shapes. Internal corners of the cutoff waveguide may be rounded, if necessary. The internal cavity of the cutoff waveguide may be empty (e.g., filled with air) or may be filled with a dielectric material.

Calculations of the internal dimensions necessary to prevent the parasitic radiation may be made depending on the shape of the cutoff waveguide.

The height h of the walls of the cutoff waveguide, when measured from the surface of the PE1, should exceed a quarter of the critical wavelength Λ for the cutoff waveguide (h>Λ/4). In this case, the critical wavelength Λ should correspond to the higher operating frequency of the switch 100. If the cutoff waveguide is filled with a dielectric material having a dielectric constant ε, the value $\Lambda_\varepsilon = \Lambda/\sqrt{\varepsilon}$ may be considered as the critical wavelength of the cutoff waveguide. That is, the critical wavelength $\Lambda_\varepsilon$ for the cutoff waveguide filled with the dielectric material, is the critical wavelength for the air-filled cutoff waveguide divided by a squared dielectric constant of the dielectric material.

Figure 2:
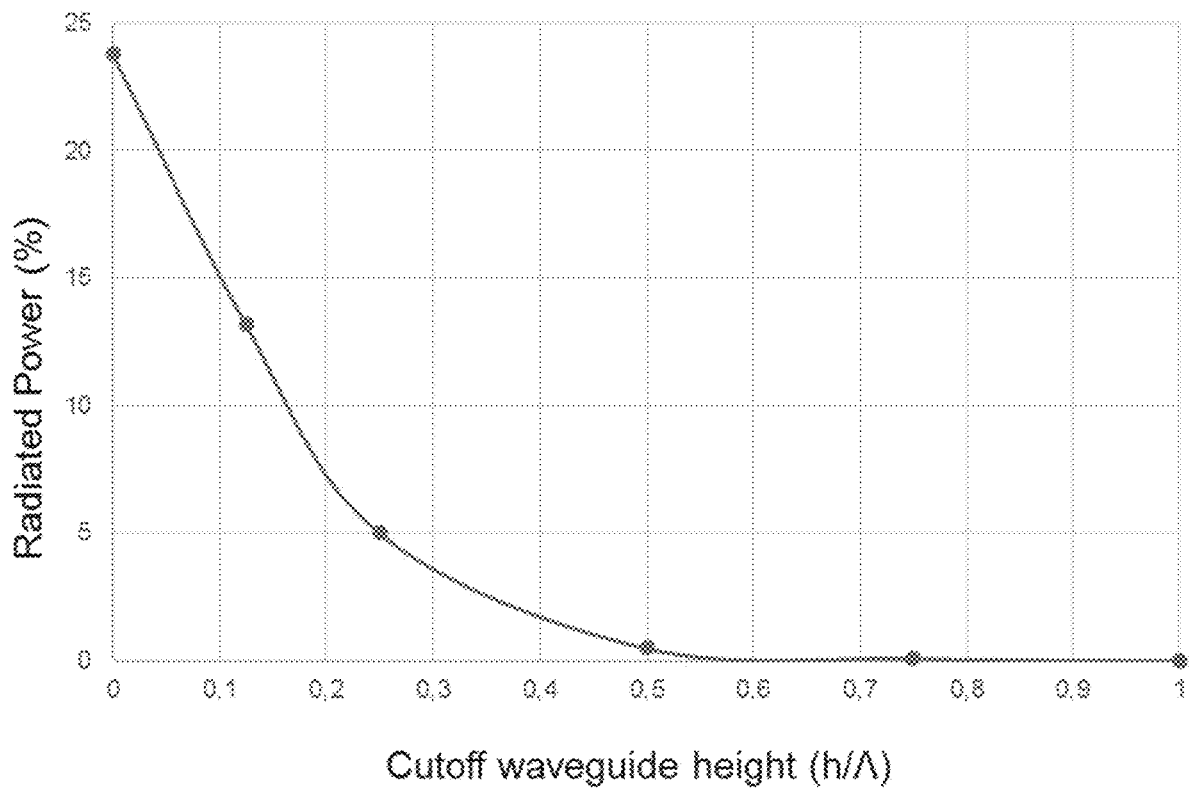
FIG. 2 illustrates an example of a result of simulating a dependence of power radiated through a photoconductive element on a height of a cutoff waveguide.

FIG. 2 illustrates an example of a result of simulating the dependence of power radiated through a photoconductive element on a height of a cutoff waveguide.

The corresponding results are also summarized in Table 1 below for convenience.

TABLE 1

| Cutoff waveguide height (h) | Radiated power, % |
|---|---|
| — | 23.8 |
| Λ/8 | 13.2 |
| Λ/4 | 5 |
| Λ/2 | 0.5 |
| 3Λ/4 | 0.1 |
| Λ | 0.01 |

As seen from the graph of FIG. 2 and Table 1, for values of h>Λ/4, the dissipated power becomes acceptable for practical usage. The higher the height of the cutoff waveguide, the lower the dissipated power. The exact height value of the cutoff waveguide may be set based on a compromise between the size of the switch 100 and the amount of dissipated power, depending on the requirements of a particular application.

Regarding remaining dimensions of the cutoff waveguide, when, for example, the cutoff waveguide has a cross-section in the form of a rectangle with a size of a×b (FIG. 1B), these sizes a and b (where a and b are, for example, a length and width, respectively, of the cutoff waveguide) are set based on the following Equation 1.

$$\Lambda = \frac{2ab}{\sqrt{(n^2 b^2 + m^2 a^2)}} \quad \text{Equation 1}$$

In Equation 1, m and n are the indices of the propagating mode.

For a rectangular cutoff waveguide, the dominant mode (the mode with the largest wavelength) is $H_{10}$, which is characterized by the ratio a>b. The critical wavelength Λ of the cutoff waveguide may be 2×a. The size a may be less than half the wavelength (a<λ/2), which corresponds to the higher operating frequency of the switch 100, to provide an effect of blocking parasitic radiation at this frequency. If the cutoff waveguide is filled with a dielectric, the above value $\Lambda_\varepsilon = \Lambda/\sqrt{\varepsilon}$ should also be taken into account.

When the cutoff waveguide has, for example, a circular shape in the cross-section with a radius a, the radius is set using the following equations.

For a critical mode wave $H_{mn}$, the radius of the cutoff waveguide may be set according to the following Equation 2.

$$\Lambda = \frac{2\pi a}{B_{mn}} \quad \text{Equation 2}$$

For a critical mode wave $E_{mn}$, the internal radius a of the cutoff waveguide may be set according to the following Equation 3.

$$\Lambda = \frac{2\pi a}{A_{mn}} \quad \text{Equation 3}$$

For a circular waveguide, the predominant modes are $H_{11}$ and $E_{01}$. The radius a should be less than the wavelength (a<λ), which corresponds to the higher operating frequency of the switch 100, to provide the effect of blocking the parasitic radiation at this frequency. If the cutoff waveguide is filled with a dielectric, the above value $\Lambda_\varepsilon = \Lambda/\sqrt{\varepsilon}$ should also be taken into account.

As a light source, an optical fiber may be introduced into the cutoff waveguide. In this case, the dielectric constant E (for example, it may be equal to 5 for an optical fiber) should be taken into account when choosing the radius a.

The PE 1 and the shorting via 6 together with the cutoff waveguide 11 and the segment of the SIW play the role of an optically controlled switch working on the basis of the photoconductivity effect. In the open state of the switch (when the PE 1 is OFF, and the electromagnetic wave passes without loss to the output port 9), the cutoff waveguide stabilizes the switch impedance and matches the input and output ports 8 and 9 to each other. This is confirmed by the graph of FIG. 3 illustrating the results of simulating the reflection coefficient of the switch at frequencies of 76-82 GHz.

Figure 3:
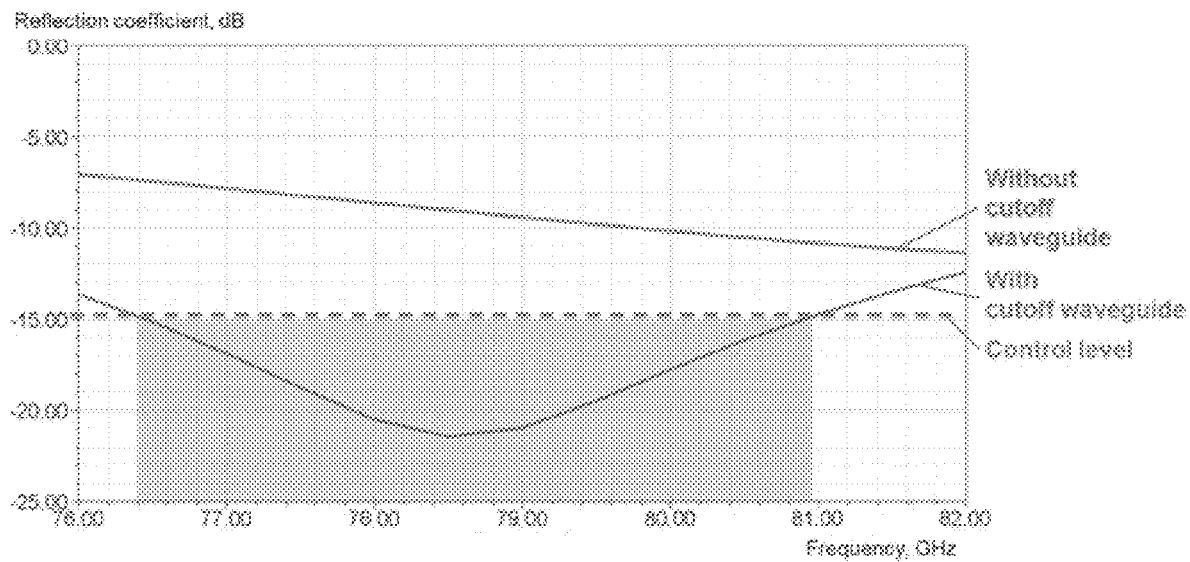
FIG. 3 illustrates an example of a result of simulating a reflection coefficient of a switch.

FIG. 3 illustrates an example of a result of simulating a reflection coefficient of a switch.

The dashed line in FIG. 3 shows a reference level of −15 dB, below which the switch becomes sub-optimal due to poor matching. In the case of the switch without the cutoff waveguide (upper solid line), the reflection coefficient is in the range of −7 dB to −11 dB, which is unacceptable for practical usage. In contrast, the switch with the cutoff waveguide (lower solid line) has the reflection coefficient below −15 dB in the frequency band of 76.4 to 81 GHz (the dark area), which indicates the improved matching in a wide frequency band.

Figure 4A:
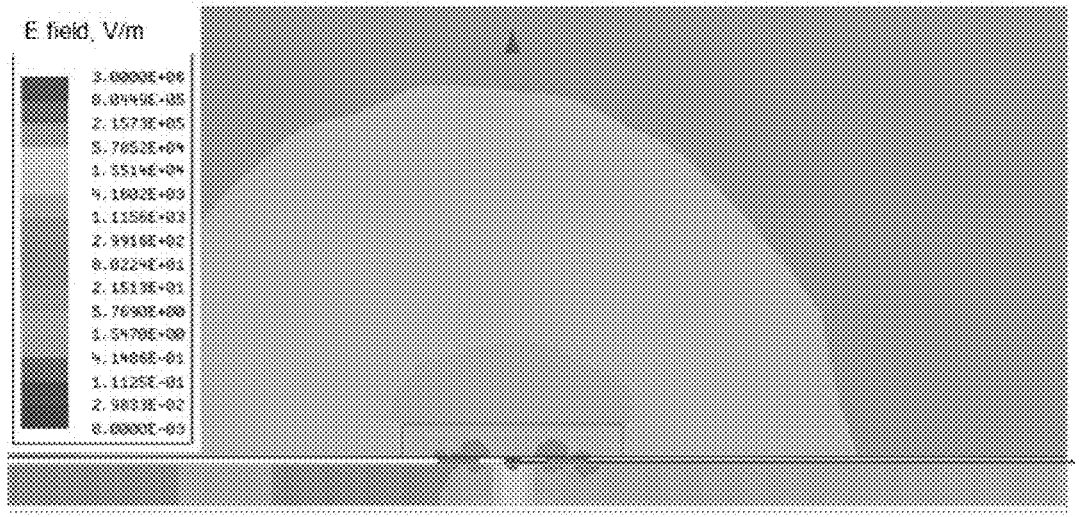
FIGS. 4A and 4B illustrate examples of signal power distributions in an area of a switch in an open state.
Figure 4B:
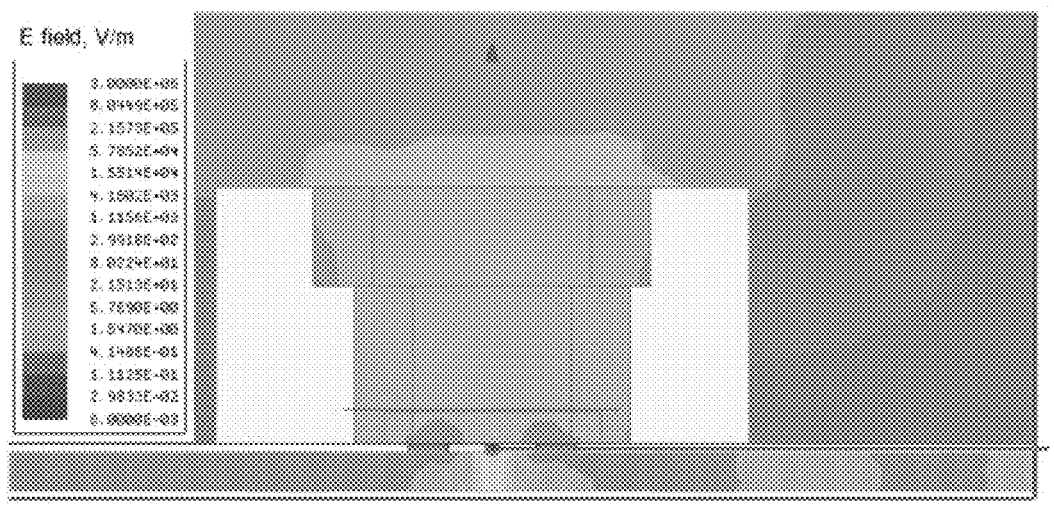

FIGS. 4A and 4B illustrate examples of signal power distributions in an area of a switch in an open state.

As shown in FIG. 4A, in the absence of the cutoff waveguide, the input and output ports are mismatched, and more than 25% of the power is radiated into free space through the photoconductive element.

In contrast, in FIG. 4B for the switch with the cutoff waveguide, it is shown that the input and output ports are matched, almost all power of the signal is delivered to the output port, passing through the SIW, and only a small amount of power (less than 4%) is radiated into free space. These characteristics may indicate that the cutoff waveguide suppresses the parasitic radiation, while reducing the switch losses.

Figure 5:
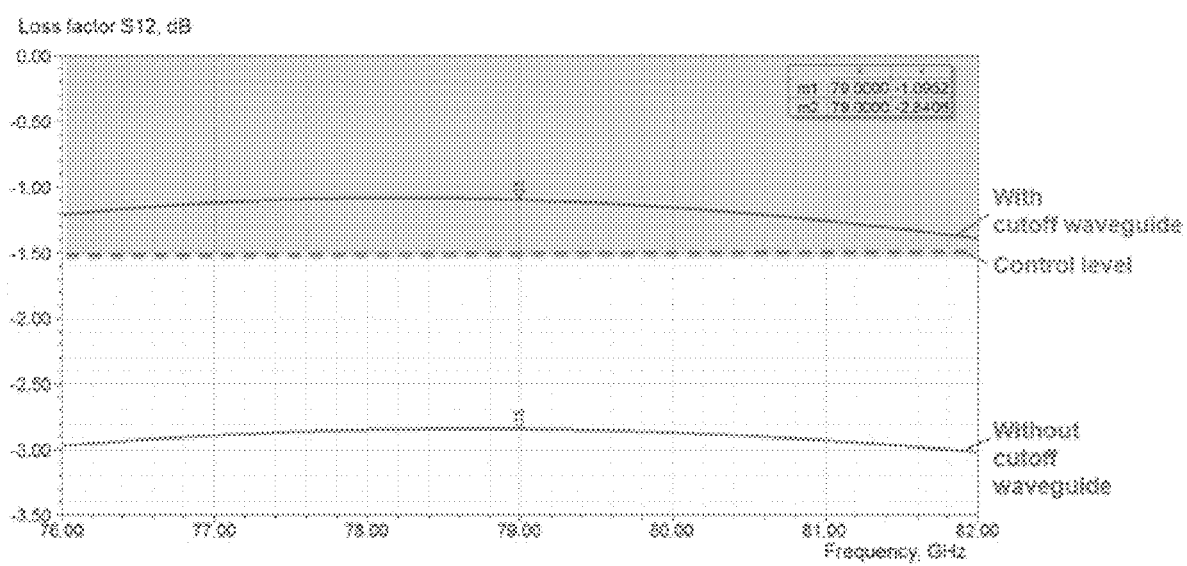
FIG. 5 illustrates an example of a result of simulating the transmission coefficient of a switch.

FIG. 5 illustrates an example of a result of simulating a transmission coefficient of a switch.

The graph in FIG. 5 demonstrates the results of simulating the transmission coefficient of the switch for frequencies 76 to 82 GHz. The dashed line in FIG. 5 shows a reference level of −1.5 dB, below which the switch becomes sub-optimal due to losses. In the switch without the cutoff waveguide (lower solid line), the transmission coefficient (the loss factor S12) is in the range of −3 dB, which corresponds to the parasitic radiation losses over 25%, and is unacceptable for practical usage.

In contrast, the switch with the cutoff waveguide (upper solid line) has a transmission coefficient higher than −1.4 dB (dark region) in the entire frequency band, with a minimum of about −1.1 dB at the center of the frequency band, which indicates the reduced losses. The parasitic radiation losses in this case are less than 4% in a wide frequency band.

At frequencies above 40 GHz, the switch with the cutoff waveguide has reduced losses and improved matching, and is not subject to the interference effect of external components, such that the switch may conduct more power. The conductive walls of the cutoff waveguide allow efficient heat removal from the light source. The absence of parasitic radiation and heating improves the switch control, reduces the required power consumption of the light source, improves isolation between the open and closed states of the switch, protects the light source from overheating, and prolongs the service life of the light source.

The supply/bias circuits of the switch are isolated from the RF path. The characteristics of the switch may be controlled by changing the power of the fed light. In addition, such a switch may be easily integrated in any desired location of the SIW. Further, the switch also has a relatively wide operating frequency band.

Examples will be described hereinafter. It should be appreciated that the disclosure is not limited to the specific examples described herein, and those skilled in the art will be able to implement other examples, being guided by the principles of creating a high-frequency switch described herein.

As mentioned above, the upper part of the cutoff waveguide 11 is designed to provide control of the PE 1. For example, the upper part of the cutoff waveguide 11 may have a hole for transmitting light or for introducing the light source itself into the cavity of the cutoff waveguide 11, partially or completely. In addition, light source control elements may be introduced through the hole in the upper part of the cutoff waveguide 11. Any suitable source may be used as a light source for the switch 100. For example, a light emitting diode (LED) 13 placed inside or outside the cutoff waveguide (for example, mounted on the upper surface of the cutoff waveguide—FIG. 6A), a laser diode with an optical fiber 14 introduced or not introduced inside the cutoff waveguide (FIG. 6B), a vertical cavity surface emitting laser (or simply a vertical-cavity surface-emitting laser (VCSEL)), and the like, may be used as the light source. In particular, an infrared light source with a wavelength of 940 nm is most effective for controlling a silicon PE. Thus, for the optically controlled switch 100, it is convenient to use a conventional infrared LED.

Figure 6A:
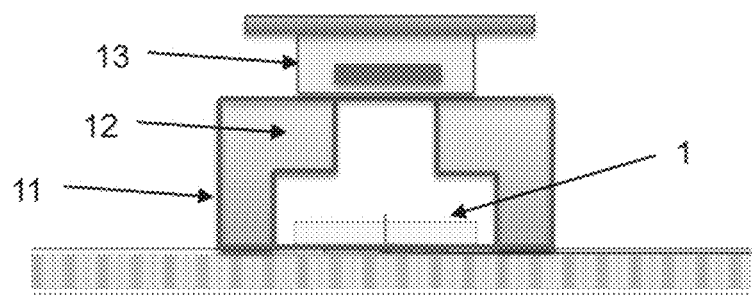
FIGS. 6A and 6B illustrate examples of using various light sources.
Figure 6B:
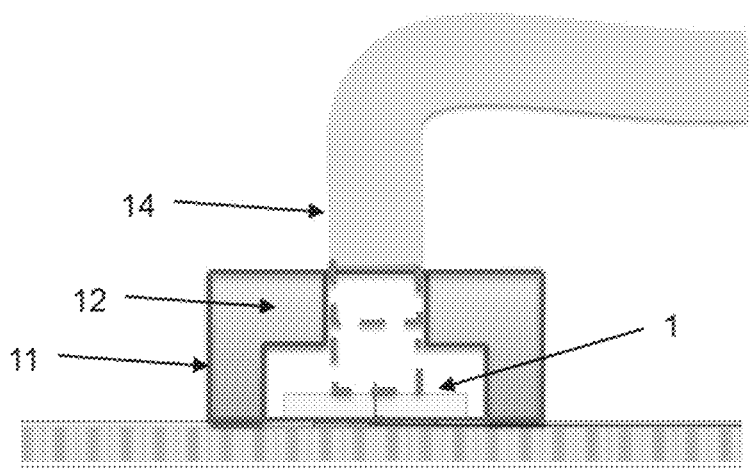

A section 12 for placing (positioning and/or fixing) the light source (see. FIG. 1A, for example) may be formed in the upper part of the cutoff waveguide 11 above the height h of the walls of the main part of the cutoff waveguide 11. The shape and dimensions of the section 12 may be set in accordance with the requirements of a particular application. For example, the outer walls of the section 12 may repeat the geometry of the outer walls of the underlying main part of the cutoff waveguide, and the inner walls may be selected to conveniently and reliably fix the LED 13, as shown in FIG. 6A (outside the section 12) or in FIG. 1A (inside the section 12), or to conveniently and reliably fix the optical fiber 14, as shown in FIG. 6B (in a circular hole between the walls of the section 12). The material of the walls of the section 12 may also be arbitrarily selected. For example, the material may be a heat dissipating material (to improve heat dissipation from the light source and thereby increase the aforementioned switch characteristics) and/or the same material as that of the underlying walls of the main part of the cutoff waveguide 11 (thereby providing simplification of design and manufacture).

In an example, an optically transparent element 15 (FIG. 7A) may be placed at a height h to $\Lambda/4$ above the PE 1, on the upper surface of the cutoff waveguide 11 or in the area above the main part of the cutoff waveguide 11 (depending on the design of the cutoff waveguide 11). The optically transparent element 15 may be in the form of a conductive grid covering the hole for light transmission. The shape of the grid may be arbitrary, but the cell size (e.g., the size of an area within grid lines) should be much less than $\Lambda \times \Lambda$, and in this case, the optically transparent element 15 may be a reflective surface for waves propagating in the waveguide. The optically transparent element 15 may be either an independent element, or may be made on the surface of the light source exposed to the PE 1. In this case, the optically transparent element 15 should be sufficiently thin and optically transparent to prevent light losses from the light source.

Figure 7A:
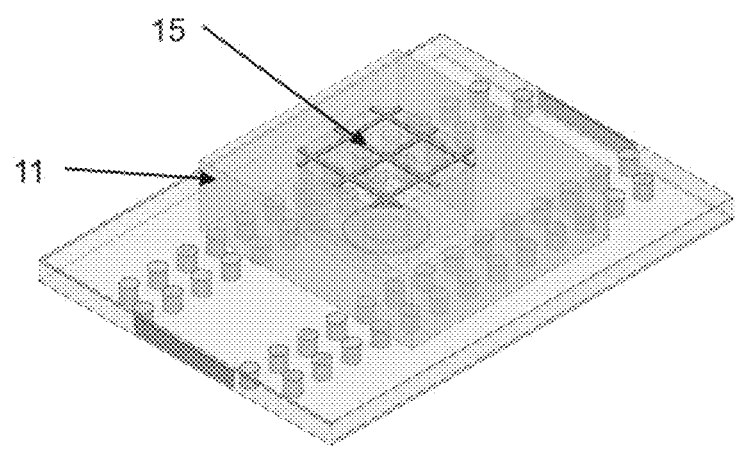
FIGS. 7A to 7C illustrate various examples of cutoff waveguide including optically transparent elements.
Figure 7B:
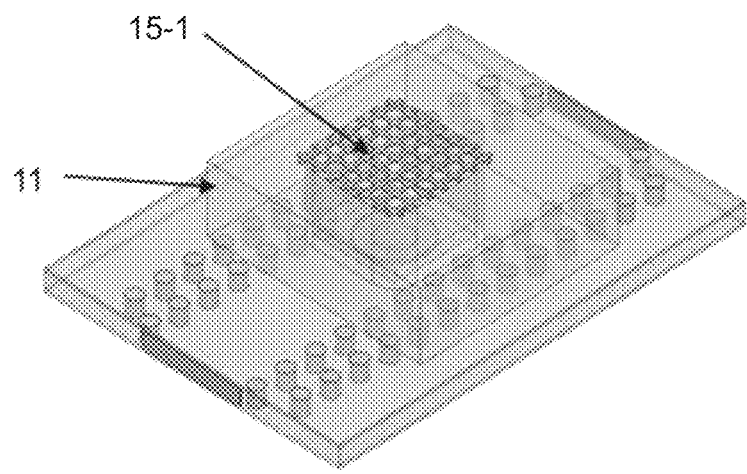
Figure 7C:
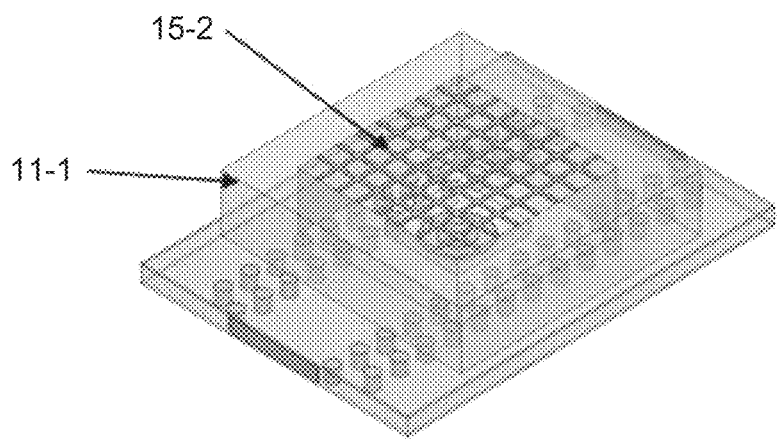

FIGS. 7A to 7C illustrate various examples of cutoff waveguides including respective optically transparent elements.

FIG. 7A illustrates the rectangular cutoff waveguide 11 having inner cross-section dimensions selected on the basis of the above relations taking into account the critical wavelength. The optically transparent element 15 having a coarse grid (less than $\Lambda \times \Lambda$) is placed on the upper surface of the cutoff waveguide. In this case, the simulation results demonstrate that the radiated power is not more than 1%.

FIG. 7B shows the same cutoff waveguide 11 as in FIG. 7A, but an optically transparent element 15-1 having a significantly finer grid in comparison to the coarse grid in FIG. 7A is provided. The simulation results of the example of FIG. 7B demonstrate that the radiated power is no more than 0.001%.

FIG. 7C shows a cutoff waveguide 11-1 having a slightly larger inner cross-section than that of the cutoff waveguide 11 of FIGS. 7A and 7B. However, even such a discrepancy with respect to the inner cavity dimensions of the cutoff waveguide 11 has no significant influence due to the inclusion of the optically transparent element 15-2, which has a grid whose cell size is less than that of the transparent elements 15 and 15-1 of FIGS. 7A and 7B, respectively. The simulation results of the example of FIG. 7C demonstrate that the radiated power is no more than 1.2%.

The dimensions of the cutoff waveguide specified to comply with the cutoff condition may not be strictly observed during manufacturing or may not be observed at all due to the requirements of a particular application (for example, if an LED is placed in a slightly wider cavity without increasing the height of the cutoff waveguide by installing the section 12).

Due to the optically transparent element e.g. (15, 15-1, or 15-2), more efficient suppression of parasitic radiation through the cutoff waveguide (e.g., 11 or 11-1) is ensured even at a low height of the walls of the cutoff waveguide, the operating frequency bandwidth is increased, and the requirements for the manufacturing quality of the cutoff waveguide and for compliance with the cutoff condition are generally reduced. It is possible to adjust the characteristics of the switch by achieving a compromise between the cell size and the transparency of the optically transparent element.

In the above described examples, the cutoff waveguide 11/11-1 is made as a single separate element installed on the SIW and having solid walls.

According to another example, a cutoff waveguide, similar to the SIW, may be constructed of one or more single-layer or multi-layer PCBs. Thus, the design of the switch may be made simple and completely based on PCBs. If one PCB is used for manufacturing the cutoff waveguide, the thickness of the PCB should correspond to the height h.

Figure 8:
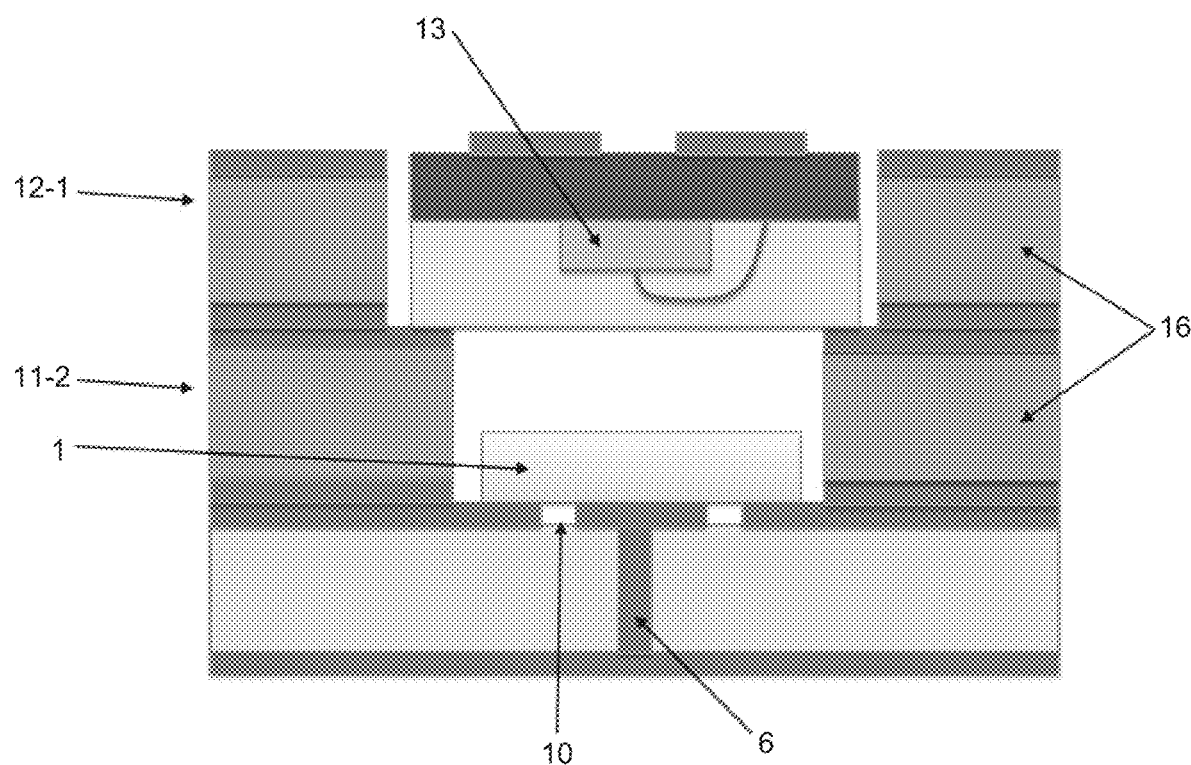
FIGS. 8 to 11 illustrate examples of a switch based on multiple PCBs.
Figure 9:
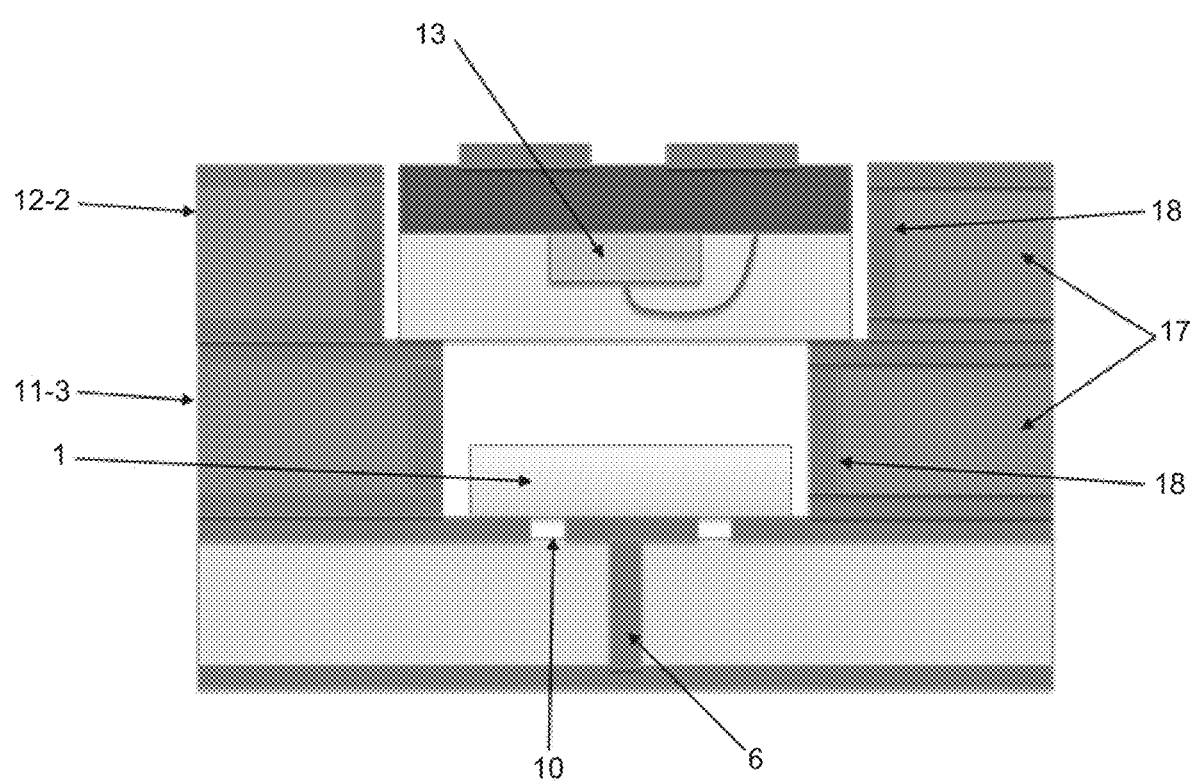
Figure 10:
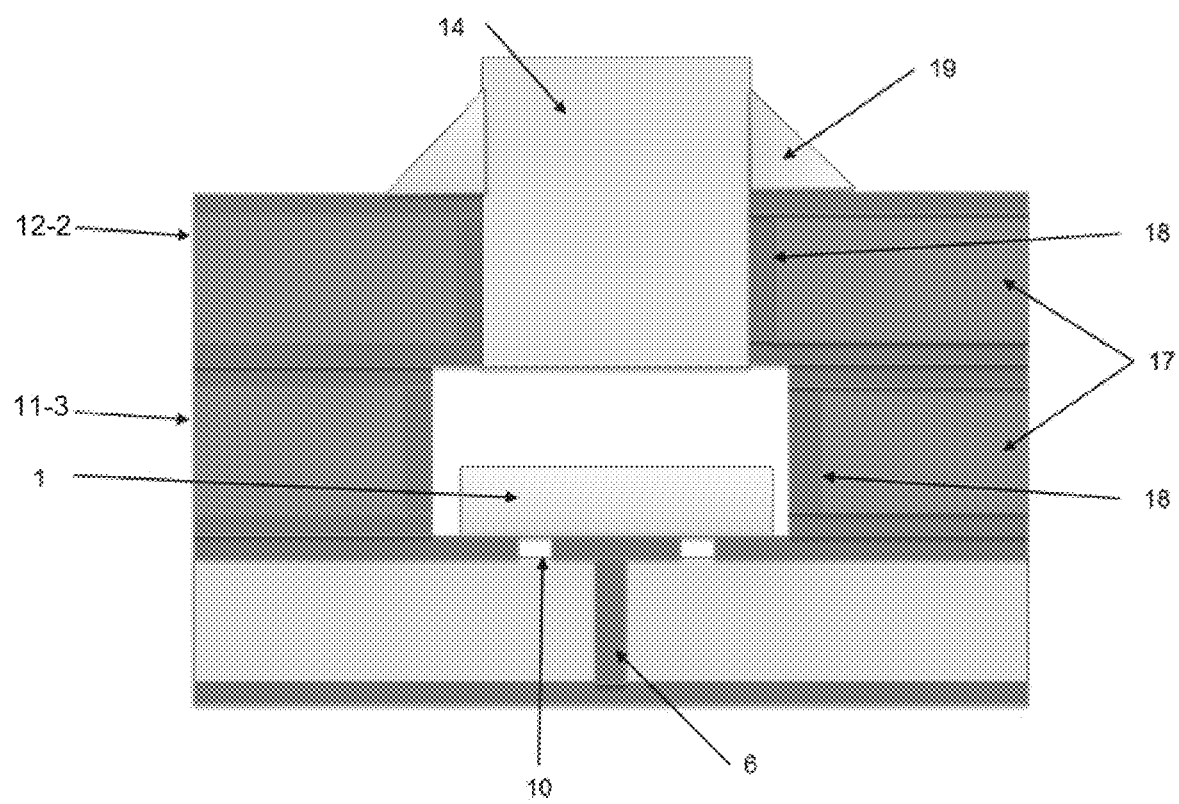
Figure 11:
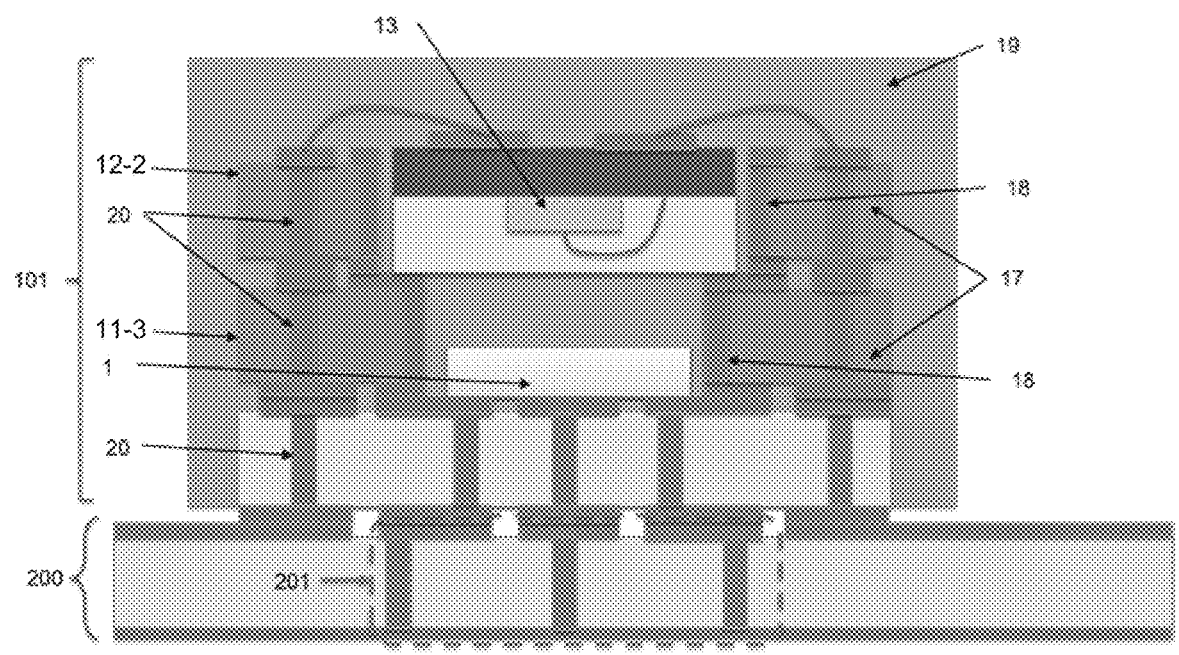

If several PCBs superimposed on each other are used to manufacture the switch, it is convenient to form a section for accommodating the light source by setting the size of the corresponding hole in each of the boards, as shown, for example, in FIGS. 8 to 11. To this end, FIGS. 8, 9, and 11 show variants in which the light source is the LED 13, and the light source is placed within the section 12-1 or 12-2, respectively, for accommodating the LED 13 formed of an upper PCB having a larger hole than a hole in the underlying PCB that forms the main part of a cutoff waveguide 11-2 or 11-3, respectively. FIG. 10 illustrates an example where the light source is the optical fiber 14, and the optical fiber 14 is fixed in a section 12-2 formed of an upper circuit board having a hole smaller than the hole in the underlying circuit board constituting the main part of the cutoff waveguide 11-3.

Considering that the walls of a cutoff waveguide should be conductive, all layers of the PCBs forming a cutoff waveguide should also be conductive. For this purpose, in the main portion of the cutoff waveguide 11-2 and the section 12-1 of FIG. 8, PCBs having a conductive substrate 16 (or simply a set of conductive sheet elements) may be used, and such PCBs (or sets of conductive sheet elements) completely function as the walls of the cutoff waveguide 11-2.

In other examples, the substrates of the PCBs may be made of a dielectric material 17, and the walls of the cutoff waveguide 11-3 may be formed by rows of vias 18 interconnecting the conductive layers of these PCBs, as shown in FIGS. 9 to 11. The distance between the vias 18 should be such to not allow waves propagating in the cutoff waveguide 11-3 through the walls. For the examples of FIGS. 9 to 11, the dielectric material 17 does not have any substantial importance, since it is actually located outside the inner wall of the waveguide. Therefore, any conventional PCBs may be used. For example, the conventional PCBs may be glass-fiber laminate FR4. The use of conventional PCBs may simplify and reduce the cost of construction of the optically controlled switch.

To increase the reliability of fixing the light source, fasteners (for example, epoxy adhesive 19, as shown in FIG. 10) may be used to fix light source (e.g., the optical fiber 14).

If necessary, in the disclosed examples, to increase the reliability of the entire construction, and transportation and operation convenience, the entire cutoff waveguide, including all its cavities, if appropriate, or the entire switch, including the SIW and the cutoff waveguide may be formed in one housing formed of a conductive or dielectric material. For example, the entire cutoff waveguide 11-3, or an entire switch 101 may also be coated with the epoxy adhesive 19, as shown in FIG. 11.

Further, as shown in FIG. 11, to create a housing and increase strength and shielding around the entire perimeter of the switch, electrically interconnected rows of vias 20 may be made in all layers of the PCBs.

Referring to FIG. 11, the optically controlled switch 101 may serve as an SMD-ready component (e.g., a chip component, which is a component for surface mounting) that may be used in high-frequency paths of signaling devices. For example, the switch 101 may be installed on other PCBs 200 containing feeder lines and antennas based on SIWs 201, as shown in FIG. 11.

It should be appreciated that the principle of construction and basic examples of the millimeter-wave optically controlled switch based on a SIW and using a cutoff waveguide are described herein. Those skilled in the art using these principles will be able to obtain other examples within the scope of the disclosure herein.

Antennas with adaptive beamforming made using the optically controlled switches disclosed herein may be used in electronic devices that require control by RF signals. For example, the electronic devices may be used in the millimeter-wave range for mobile communication networks of the future standards 5G, 6G, and WiGig, for different sensors, for Wi-Fi networks, for wireless power transmission, including long distance wireless power transmission, for "smart home" systems, for car navigation, for the Internet of things (IoT), for wireless power charging, and the like.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An optically controlled switch, comprising:
 a substrate integrated waveguide (SIW) comprising:
  a first port and a second port, the first port and the second port being located at ends of the SIW to input and output an electromagnetic wave; and
  a shorting via electrically connected to a bottom layer of the SIW and separated from a top layer of the SIW by a dielectric gap;
 a photoconductive element located on the top layer of the SIW and electrically connected to the shorting via and the top layer of the SIW, the photoconductive element being configured to have a dielectric state and a conductor state depending on a state of a controlling light flux; and
 a cutoff waveguide formed around the dielectric gap and the photoconductive element, and formed by conductive walls projecting from the top layer of the SIW, the cutoff waveguide being configured to provide control of the photoconductive element from a light source and block parasitic radiation of a wave passing through the SIW via the dielectric gap and the photoconductive element,
 wherein a wall height of the cutoff waveguide is greater than or equal to a quarter of a critical wavelength of the cutoff waveguide.

2. The optically controlled switch of claim 1, wherein an internal cavity of the cutoff waveguide is filled with air, and
 wherein the critical wavelength is higher than a length corresponding to an operating frequency of the switch.

3. The optically controlled switch of claim 1, wherein an internal cavity of the cutoff waveguide is filled with a dielectric material, and
 wherein the critical wavelength is a critical wavelength for the cutoff waveguide, formed as an air-filled cutoff waveguide, divided by a squared dielectric constant of the dielectric material.

4. The optically controlled switch of claim 1, wherein the cutoff waveguide has a cross-section in the form of a rectangle with a size of a×b, wherein a is greater than b, and a is less than half a critical wavelength for the cutoff waveguide.

5. The optically controlled switch of claim 1, wherein the cutoff waveguide has a cross-section in the form of a circle having a radius, and
   wherein the radius is less than the critical wavelength of the cutoff waveguide.

6. The optically controlled switch of claim 1, further comprising:
   an optically transparent element configured to provide control of the photoconductive element from the light source, and having a form of a conductive grid covering a hole in the cutoff waveguide,
   wherein a cell size of the optically transparent element is less than a critical wavelength for the cutoff waveguide.

7. The optically controlled switch of claim 6, further comprising:
   the light source,
   wherein the light source is configured to provide light to the photoconductive element, and
   wherein the optically transparent element is disposed on a surface of the light source exposed to the photoconductive element.

8. The optically controlled switch of claim 1, wherein the SIW further comprises:
   a printed circuit board (PCB) comprising the top layer of the SIW, the bottom layer of the SIW, and a dielectric layer between the top layer and the bottom layer; and
   at least two rows of vias connected to the top layer and the bottom layer of the PCB and configured to form side walls of the SIW,
   wherein neighboring vias in the rows of vias are arranged apart from each other at a distance less than one tenth of a wavelength of an electromagnetic wave fed to the switch.

9. The optically controlled switch of claim 8, wherein the distance is more than half an operating wavelength.

10. The optically controlled switch of claim 1, further comprising:
    the light source,
    wherein the light source is configured to provide light to the photoconductive element.

11. The optically controlled switch of claim 10, wherein the cutoff waveguide further comprises a section accommodating the light source.

12. The optically controlled switch of claim 1, wherein the cutoff waveguide is constructed of a PCB having one or more layers.

13. The optically controlled switch of claim 12, wherein all layers of the PCB are conductive.

14. The optically controlled switch of claim 12, wherein substrates of the PCB are made of a dielectric material, and
    wherein the conductive walls are formed by rows of vias connecting conductive layers of the PCB to each other.

15. The optically controlled switch of claim 1, wherein the optically controlled switch is formed in a single housing constructed of a conductive or dielectric material.

16. The optically controlled switch of claim 1, further comprising the light source,
    wherein the light source comprises an LED disposed above the photoconductive element, and disposed in or above an upper portion of the cutoff waveguide.

17. The optically controlled switch of claim 1, further comprising the light source,
    wherein the light source comprises an optical fiber fixed inside an upper portion of the cutoff waveguide.

* * * * *